United States Patent [19]

Bergeron et al.

[11] 4,373,166
[45] Feb. 8, 1983

[54] SCHOTTKY BARRIER DIODE WITH CONTROLLED CHARACTERISTICS

[75] Inventors: D. L. Bergeron, Winooski; Daniel J. Fleming, South Burlington, both of Vt.; Geoffrey B. Stephens, Cary, N.C.

[73] Assignee: IBM Corporation, Armonk, N.Y.

[21] Appl. No.: 218,156

[22] Filed: Dec. 19, 1980

Related U.S. Application Data

[63] Continuation of Ser. No. 971,166, Dec. 20, 1978, abandoned.

[51] Int. Cl.³ ............. H01L 29/48; H01L 29/64; H01L 29/56
[52] U.S. Cl. ............. 357/15; 357/67; 357/91; 357/13
[58] Field of Search ............. 357/15, 67, 91, 13

[56] References Cited

U.S. PATENT DOCUMENTS

| | | | |
|---|---|---|---|
| 4,045,248 | 8/1977 | Shannon et al. | 357/15 |
| 4,107,719 | 8/1978 | Graui et al. | 357/15 |
| 4,136,348 | 1/1979 | Damene | 357/15 |
| 4,149,174 | 4/1979 | Shannon | 357/15 |
| 4,156,246 | 5/1979 | Pedersen | 357/15 |
| 4,173,063 | 11/1979 | Kniepkamp et al. | 357/15 |
| 4,201,998 | 5/1980 | Cho et al. | 357/15 |

OTHER PUBLICATIONS

Solid State Electron, as; Control of Schottky Barrier Height Using Highly Doped Surface Layers; by Shannon, vol. 19, 1976, pp. 537-543.

Solid State Devices and Components for A60 GHz Communication System; 1973 National Tele-Communication Conference; vol. II pp. 23A-1 to 23A-7.

*Primary Examiner*—Andrew J. James
*Attorney, Agent, or Firm*—John E. Hoel

[57] ABSTRACT

A self-isolated Schottky Barrier diode structure and method of fabrication are disclosed for generating a device having controlled characteristics. An opening is made through an oxide layer over a central region of an n-type semiconductor substrate. The opening has inclined sidewalls over an annular region surrounding the central region of the substrate. An n-type dopant layer is ion implanted through the opening and the surrounding oxide layer. This controls the barrier height for the Schottky Barrier diode and controls the lifetime of minority carriers in the outside region of the substrate. This has the effect of minimizing PNP parasitic transistor action. A Schottky Barrier contact is formed in the opening through an oxide layer creating a rectifying junction with the semiconductor substrate in the central region.

7 Claims, 6 Drawing Figures

SCHOTTKY BARRIER DIODE WITH CONTROLLED CHARACTERISTICS

This is a continuation, of application Ser. No. 971,166 filed Dec. 20, 1978, now abandoned.

FIELD OF THE INVENTION

The invention disclosed broadly relates to semiconductor devices and more particularly relates to improvement in diode devices.

BACKGROUND OF THE INVENTION

In the implementation of high speed logic, it is often desirable to use a Schottky Barrier diode to prevent the saturation of the switching transistor. The degree of improvement is limited however by the nominal barrier height, the variability in barrier height due to the epitaxial doping level, and the series resistance between the Schottky Barrier diode and the collector contact.

Typical prior art formation of Zener diodes on a large scale integrated circuit chip required extra processing steps to achieve a controlled low breakdown voltage comparable to the signal levels on the chip.

In typical prior art applications of Schottky Barrier diodes in large scale integrated circuitry, the Schottky Barrier contact is made at one point on the surface of the semiconductor substrate and serves as the anode for the device. The Schottky Barrier diode contact may be aluminum which is placed directly in contact with an n-type epitaxial layer of silicon. Located at a position proximate to the Schottky Barrier diode contact is an ohmic contact which serves as the cathode of the diode and is formed by placing an aluminum layer in contact with an n+ diffusion in the epitaxial layer. When the anode is biased positively with respect to the cathode, conventional current flows from the Schottky Barrier contact, through the bulk of the epitaxial layer to the negatively biased ohmic contact. A voltage drop associated with the current flow occurs across the Schottky Barrier which is a function of the epitaxial doping and the bulk epitaxy resistance. Thus, the forward biased diode voltage drop for a Schottky Barrier diode is the sum of the potential drop across the junction $V_j$ plus the series resistance voltage drop through the epitaxial layer between the anode and the cathode. Typical n-type epitaxial silicon layers have a conductivity which varies by as much as plus or minus 50%. Thus the contribution of the junction and series resistance voltage drop across the Schottky Barrier diode can vary significantly from one LSI process batch to another. Thus Schottky Barrier diodes have had only limited usage in large scale integrated circuit design in the prior art due to their substantial variability in their resulting characteristics.

OBJECTS OF THE INVENTION

It is therefore an object of the invention to provide an improved Schottky Barrier diode.

It is still another object of the invention to provide controlled characteristics for Schottky Barrier diode.

It is still a further object of the invention to lower the barrier of a Schottky diode in an improved manner.

It is yet a further object of the invention to reduce the series resistance of the Schottky Barrier diode.

It is yet another object of the invention to provide a tighter manufacturing tolerance for the barrier height and series resistance of a Schottky Barrier diode.

It is yet a further object of the invention to provide a reduced parasitic action between Schottky Barrier diodes and adjacent p-type diffusions or other Schottky Barrier diodes.

It is still a further object of the invention to provide a low resistance region self-aligned to a Schottky Barrier diode.

It is yet further object of the invention to provide an improved Schottky Barrier Zener diode.

It is yet a further object of the invention to provide an improved Schottky Barrier Zener diode with controlled characteristics.

SUMMARY OF THE INVENTION

These and other objects, features and advantages of the invention are accomplished by the Schottky Barrier diode with controlled characteristics disclosed herein. A self-isolated Schottky Barrier diode structure and method of fabrication are disclosed for generating a device having controlled characteristics. An opening is made through an oxide layer over a central region of an n-type semiconductor substrate. The opening has inclined sidewalls over an annular region surrounding the central region of the substrate. An n-type dopant layer is ion implanted through the opening and the surrounding oxide layer. The ion-implanted layer has a substantially Gaussian distribution of its concentration with respect to depth in the substrate. In the central region beneath the opening, the end of the distribution intersects the surface of the substrate at a second concentration which is between 2 and 10 times greater than the background concentration of the substrate. This controls the barrier height for the Schottky Barrier diode. The distribution has a peak concentration which is located beneath the surface of the substrate at a first distance in the central region. This peak concentration gradually rises toward the substrate surface substantially parallel with the inclined sidewalls of the opening in the annular region of the substrate. In the region of the substrate surrounding the annular region, where the ion implantation takes place through the full thickness of the oxide, the distribution intersects the substrate surface at a third concentration which is at least 10 times greater than the second concentration where the end of the distribution intersects the surface in the central region. This third concentration controls the lifetime of minority carriers in the outside region of the substrate. This has the effect of minimizing PNP parasitic transistor action. A Schottky Barrier contact is formed in the opening through the oxide layer creating a rectifying junction with the semiconductor substrate in the central region. The structure can be extended to include a second opening through the oxide layer over the outside region of the substrate and the formation of an ohmic contact in the second opening to make a low series resistance connection to the Schottky Barrier diode. The resulting device achieves a lower barrier for the Schottky Barrier diode and a lower series resistance to the Schottky Barrier diode than was available in the prior art. In addition, the ion implant can be used to form a Schottky Barrier Zener diode with controllable characteristics.

DESCRIPTION OF THE FIGURES

These and other objects, features and advantages of the invention will be more fully appreciated with reference to the accompanying figures.

DISCUSSION OF THE PREFERRED EMBODIMENT

A self-isolated Schottky Barrier diode structure and method of fabrication are disclosed for generating a device having controlled characteristics. An opening is made through an oxide layer over a central region of an n-type semiconductor substrate. The opening has inclined sidewalls over an annular region surrounding the central region of the substrate. An n-type dopant layer is ion implanted through the opening and the surrounding oxide layer. The ion-implanted layer has a substantially Gaussian distribution of its concentration with respect to depth in the substrate. In the central region beneath the opening, the end of the distribution intersects the surface of the substrate at a second concentration which is between 2 and 10 times greater than the background concentration of the substrate. This controls the barrier height for the Schottky Barrier diode. The distribution has a peak concentration which is located beneath the surface of the substrate at a first distance in the central region. This peak concentration gradually rises toward the substrate surface substantially parallel with the inclined sidewalls of the opening in the annular region of the substrate. In the region of the substrate surrounding the annular region, where the ion implantation takes place through the full thickness of the oxide, the distribution intersects the substrate surface at a third concentration which is at least 10 times greater than the second concentration where the end of the distribution intersects the surface in the central region. This third concentration controls the lifetime of minority carriers in the outside region of the substrate. This has the effect of minimizing PNP parasitic transistor action. A Schottky Barrier contact is formed in the opening through the oxide layer creating a rectifying junction with the semiconductor substrate in the central region. The structure can be extended to include a second opening through the oxide layer over the outside region of the substrate and the formation of an ohmic contact in the second opening to make a low series resistance connection to the Schottky Barrier diode. The resulting device achieves a lower barrier for the Schottky Barrier diode and a lower series resistance than was available in the prior art. In addition, the ion implant can be used to form a Schottky Barrier Zener diode with controllable characteristics.

Figure 1:
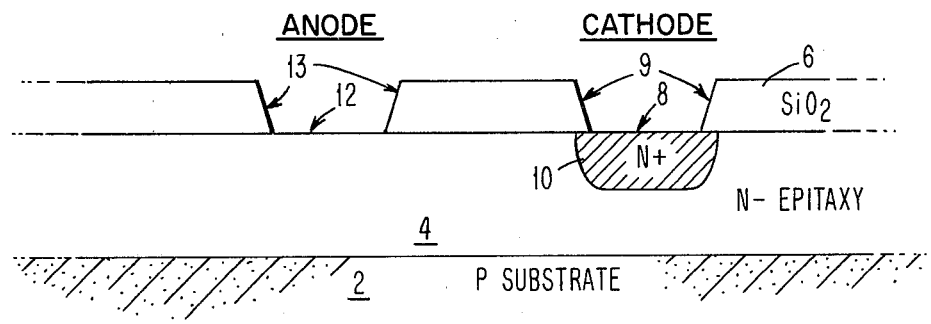
FIG. 1 is a cross-sectional view of a first stage in the fabrication of the Schottky Barrier diode with controlled characteristics where openings are formed through a silicon dioxide layer for the anode and cathode of the diode in a silicon semiconductor substrate.

FIG. 1 is a cross-sectional view of a first stage in the manufacture of the Schottky Barrier diode with controlled characteristics. A p-type silicon substrate 2 has deposited on its surface an n- epitaxial silicon layer 4 to a thickness of approximately 2 microns and a conductivity of approximately 2 ohm centimeters. A 3000 Å thick layer of silicon dioxide 6 is grown on the surface of the epitaxial layer 4 and a window 8 opened where the ultimate location of the cathode for the Schottky Barrier diode will be. An n+ diffusion 10 is then deposited through the window 8 to form the ohmic contact for the cathode in the ultimate device. This is followed by the opening of the window 12 through the silicon dioxide layer at the position where the anode for the ultimate device will be located, proximate to the location of the window 8, having an anode-to-cathode separation distance of approximately 5 microns.

Figure 2A:
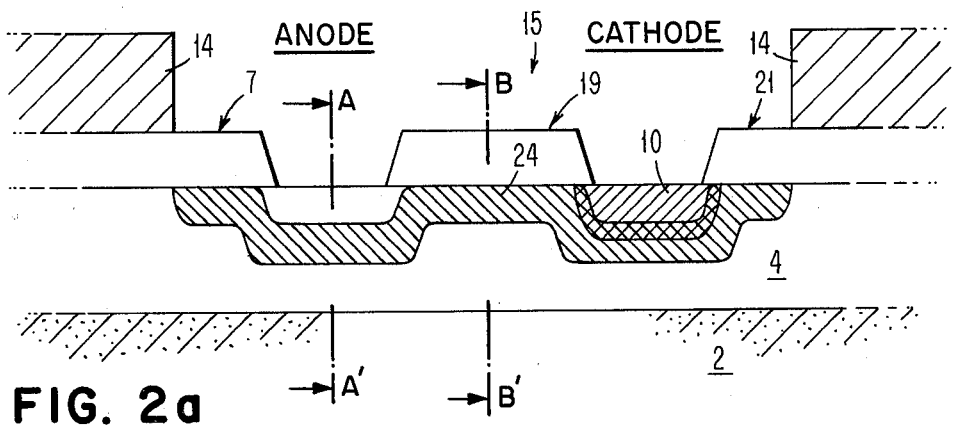
FIG. 2a is a cross-sectional view of a later stage in the fabrication of the Schottky Barrier diode with controlled characteristics where a photoresist-defined n-type buried layer has been ion implanted into the semiconductor substrate.

FIG. 2A shows a later stage in the process for fabricating the Schottky Barrier diode with controlled characteristics. The windows 8 and 12 have been formed by an etching process whereby a tapered contour for the sidewalls 9 and 13 is formed which is less than or approximately equal to 45 degrees as typically achieved with prior art etching techniques.

Figure 3:
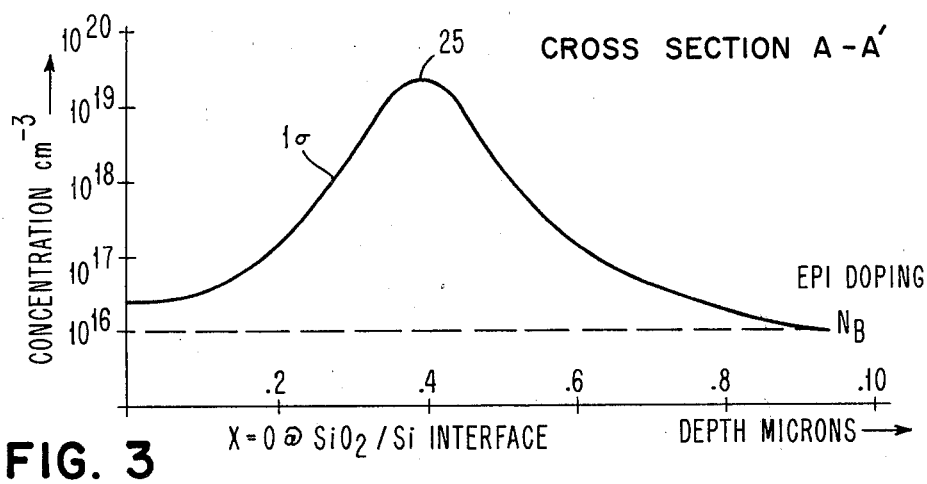
FIG. 3 is a doping profile through section A—A' of FIG. 2.
Figure 4:
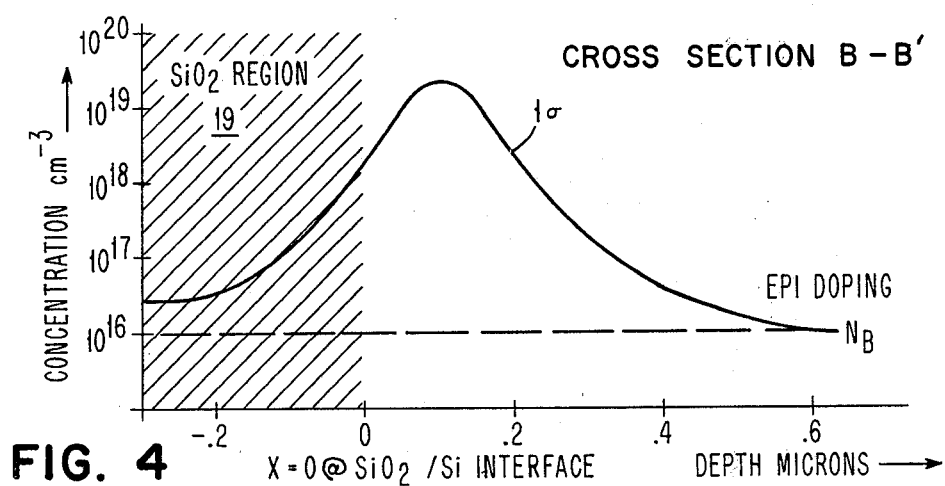
FIG. 4 is a doping profile through the cross-section B—B' of FIG. 2.

As is shown in FIG. 2a, a 2 micron thick layer of photoresist 14 is deposited on the surface of the silicon dioxide layer 6 leaving the window 15 exposed which encompasses both the anode and the cathode region of the Schottky Barrier diode to be formed. The photoresist layer 14 will serve as an ion-implantation mask preventing the penetration of accelerated ions into the epitaxial layer 4. A 300 Kev energy phosphorous ion implant is directed into the window region 15 shown in FIG. 2a at a dosage of approximately $1 \times 10^{14}$ atoms per square centimeter. A subsequent anneal or drive-in is done at approximately 900°–1000° C. for 30 minutes to activate the implanted carriers and drive them to a deeper junction if desired. The energy of approximately 300 Kev for phosphorous ions is just sufficient to allow the ions to penetrate through the 3000 Å thickness of silicon dioxide 6 at locations 17, 19 and 21. The peak of the Gaussian distribution after annealing for the ion-implanted profile, as is shown in FIG. 4, falls at or near the interface between the silicon dioxide layer 6 and the silicon epitaxial layer 4 at the locations 17, 19 and 21. Since there is no silicon dioxide covering the epitaxial layer in the window regions 8 and 12, the phosphorous implant will follow the contour of the oxide step at the sidewalls 9 and 13 maintaining a lateral as well as vertical spacing from the metal in the contact region. The profile of the concentration of the ion-implanted region at the section A—A' in the window 12 is shown in FIG. 3. It may be seen there that the tail of the distribution 23 intersects the upper surface of the epitaxial layer 4 at a selected concentration which is higher than the doping layer of the epitaxial layer 4 and serves to predictably adjust the barrier height for the resulting Schottky Barrier diode formed in the window 12.

The relative distance of the peak of the implant concentration 25 to the Si surface controls the reverse bias depletion layer spreading and hence the reverse bias breakdown.

The integral of the implanted dopant determines the series resistance from the anode to the cathode. In addition the integral of the dopant also determines the recombination rate of minority carriers injected by the Schottky Barrier diode, the higher the integrated doping, the faster the minority carrier recombination rate.

As a result, the parasitic PNP action due to minority carrier injection between adjacent Schottky Barrier diodes can be minimized.

The resulting ion-implanted layer 24 in FIG. 2a represents the peak of the Gaussian distribution for the ion implantation plus or minus one standard deviation, as may be seen in FIGS. 3 and 4.

Figure 2B:
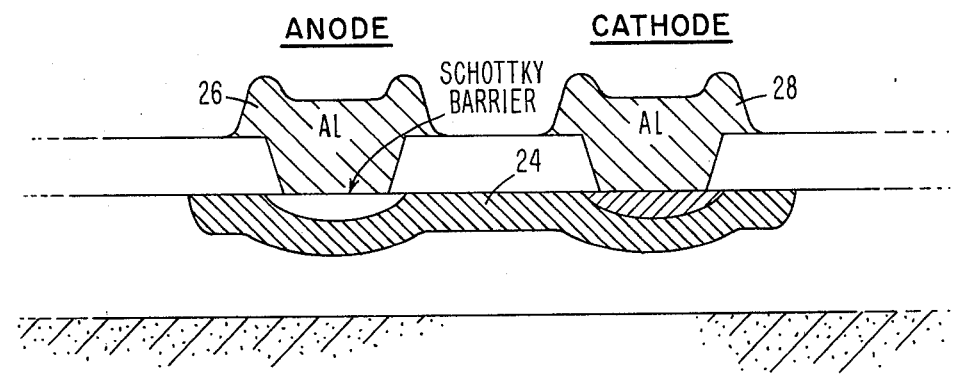
FIG. 2b shows the completion of the device shown in FIG. 2a, with the deposition of a metal layer.

FIG. 2b shows the completion of the process for fabricating the Schottky Barrier diode with controlled characteristics where an aluminum layer is deposited forming the contact 26 and contact 28 in the windows 12 and 8, respectively. The aluminum contact 26 forms a Schottky Barrier to the n epitaxial layer 4 in the window 12, forming the anode of the Schottky Barrier diode device. The aluminum contact 28 in the window 8 directly contacts the n+ diffusion 10, thereby forming an ohmic contact which is the cathode for the Schottky Barrier diode device. The ion-implanted region 24 lowers the barrier height of the Schottky Barrier diode in the window 12 by providing a controlled higher doping level at the interface as is shown in FIG. 3. In addition, the ion-implanted layer 24 provides a reduced series resistance between the anode at the window 12 and the cathode at the window 8 since current flowing from the anode to the cathode need not flow through the higher resistance bulk region 4 of the epitaxial layer but may flow through the lower resistance ion-implanted region 24. Furthermore, the resulting characteristics of the Schottky Barrier diode device have a tighter manufacturing tolerance in both the barrier height for the diode and the series resistance for the diode because of the greater control over the dopant concentration which is available for the ion-implanted region, with respect to that of the epitaxial layer 4. Still further, under certain conditions, the Schottky Barrier at the window 12 will generate holes into the n-type epitaxial layer 4. These holes can diffuse away from the anode region in prior art structures leading to undesired parasitic action between adjacent Schottky Barrier diodes or adjacent p diffusions. This is minimized in the structure shown in FIG. 2b by virtue of the higher re-combination rate provided by the n-type doped ion-implanted region 24.

Figure 5:
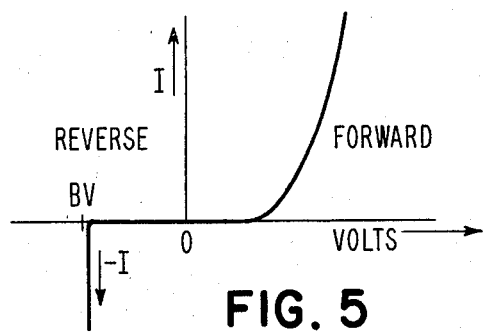
FIG. 5 is a graph of the current versus voltage characteristics for the forward and the reverse operation of the Schottky Barrier diode with controlled characteristics.

Reference to FIG. 5 will illustrate the operating characteristics of the Schottky Barrier diode with controlled characteristics. The forward diode voltage drop is substantially reduced over that available in the prior art Schottky Barrier diodes because of the reduced series resistance and lower barrier height.

The series resistance between the anode and cathode of the Schottky Barrier diode is reduced by the implanted region 24 (FIG. 2a). Since the resistance is a function of the bulk doping levels between the anode and cathode, the implant serves to increase the integrated doping level, to lower the series resistance in the diode. The increase in the integrated doping surrounding the diode also serves to decrease minority carrier lifetime, and hence any parasitic action to adjacent devices.

The forward voltage drop across the diode is selectively adjusted by the intersection of the tail of the implant at the metal-Si interface. The barrier height at the metal-Si interface is adjusted by the Schottky Barrier lowering due to the adjustment of the intrinsic electric field by the tail 23 of the implanted region 24 at the interface.

In addition to the forward bias diode characteristics of the Schottky Barrier diode shown in FIG. 2b, improved reverse breakdown characteristics are also achieved with the device. In particular, an adjustable Zener diode is formed by the structure. Reference to FIG. 3 will illustrate how the improved and controlled Zener reverse bias diode characteristics are obtained. If there were no ion-implanted region 24 in the structure shown in FIG. 2b, when the Schottky Barrier diode formed in window 12 was reverse biased, a depletion layer surrounding the junction of the diode would spread into the bulk of the epitaxial layer 4. Contrast this with the situation shown in FIG. 2b where the n-type ion-implanted region 24 has raised the n-type dopant concentration by three orders of magnitude at a depth of approximately 0.4 microns below the surface of the epitaxial layer. In this situation, the spreading of the depletion layer surrounding the junction of the Schottky Barrier diode is prevented by the ion-implanted region 24, thereby increasing the peak electric field for a given voltage. As a result, the diode approaches the avalanche breakdown at a lower voltage than would otherwise be the case. Thus, proper selection of the implant energy which locates the peak of the Gaussian distribution for the ion-implanted region as shown in FIG. 3, determines the resulting reverse biased avalanche breakdown voltage for the Zener diode. Thus, by adjusting the acceleration voltage for the ion-implanted region 24, and in addition by adjusting the dose or concentration of the dopant in the ion-implanted region 24, the Zener breakdown voltage for the resulting Schottky Barrier diode can be controlled. A substantial advantage accrues to this structure as shown in FIG. 5 since the Zener breakdown voltage can be made substantially smaller than the typical prior art voltage so that it can approximate signal voltage levels on the large scale integrated circuit chip without unduly complex manufacturing techniques.

It is important to note that the fabrication of Schottky Barrier diodes with this technique can be designed to achieve several specific device characteristics. The specific choices of implanted dose, energy, anneal time and temperature, and oxide thickness 19, determine the surface concentration and hence barrier height, the integrated doping levels and hence series resistance and minority carrier lifetime, and the distance from the metal interface to the peak of the implanted region and hence the depletion layer spreading and resulting breakdown. As can been seen, the single process step of fabricating the implanted region 24 allows for the design of Schottky Barrier diodes with specific device characteristics, where the specific characteristics are a function of the implant energy, dose, and oxide thickness.

In addition it is important to note that the implanted region 24 follows the contour of the surface oxide region 19 and as a result the doping profile peak is self-aligned to the Schottky Barrier diode contact opening 12. This results in improved device density and performance.

While the invention has been particularly shown and described with respect to the preferred embodiments thereof, it will be understood by those skilled in the art that the foregoing and other changes in form and details may be made therein without departing from the spirit and the scope of the invention.

Having thus described our invention, what we claim as new, and desire to secure by Letters Patent is:

1. A self-isolated Schottky Barrier diode with controlled characteristics, comprising:
    a semiconductor substrate of a first conductivity type and first concentration;

an insulating layer overlying said substrate having a first thickness;

a first opening through said insulating layer over a central region, having inclined sidewalls over an annular region surrounding a first region in said substrate;

an ion-implanted layer of said first conductivity type in said central region having a substantially Gaussian distribution of its concentration with respect to depth of implantation in said substrate, with the end of said distribution intersecting the surface of said substrate at a second concentration of between 2 and 10 times said first concentration, and having a peak concentration at a first distance in said first region, said second concentration controlling the barrier height for the Schottky Barrier diode;

said ion-implanted layer gradually rising toward said substrate surface and substantially parallel with said inclined sidewall;

said first distance being greater than said first thickness for said insulating layer so that said distribution intersects said substrate surface at an outside region outside of said annular region at a third concentration which is at least 10 times greater than said second concentration, said third concentration controlling the lifetime of minority carriers in said outside region;

a Schottky Barrier contact formed in said first opening forming a rectifying junction with said semiconductor substrate in said central region;

a second opening through said insulating layer over said outside region of said substrate;

an ohmic contact formed in said second opening, making electrical contact with said ion-implanted layer in said outside region;

whereby a self-isolated Schottky Barrier diode is formed with controlled characteristics and a lower series resistance connection is made to said Schottky Barrier diode.

2. The structure of claim 1, wherein said sidewall inclination is less than 45 degrees with respect to said substrate surface.

3. The structure of claim 1 wherein said third concentration is greater than $10^{18}$ dopant atoms per cubic centimeter.

4. The structure of claim 1, wherein said Schottky Barrier contact is composed of a material selected from the group consisting of an aluminum silicon alloy, platinum, tantalum, chromium, molybdenum, and titanium tungsten alloy.

5. The structure of claim 1, wherein said Schottky Barrier diode is the collector of a bipolar transistor.

6. The structure of claim 1, wherein said first conductivity type is n type.

7. A self-isolated Schottky Barrier Zener diode with controlled characteristics, comprising:

a semiconductor substrate of a first conductivity type and first concentration;

a Schottky Barrier contact formed in said first opening forming a rectifying junction with said semiconductor substrate in said central region;

a second opening through said insulating layer over said outside region of said substrate;

an ohmic contact formed in said second opening, making electrical contact with said ion-implanted layer in said outside region;

whereby a self-isolated Schottky Barrier Zener diode is formed with controlled characteristics and a lower series resistance connection is made to said Schottky Barrier Zener diode.

* * * * *